US012237166B2

(12) United States Patent
Zandi et al.

(10) Patent No.: US 12,237,166 B2
(45) Date of Patent: Feb. 25, 2025

(54) METHODS FOR SELECTIVE REMOVAL OF SURFACE OXIDES ON METAL FILMS

(71) Applicant: Tokyo Electron Limited, Tokyo (JP)

(72) Inventors: Omid Zandi, Austin, TX (US); Paul Abel, Austin, TX (US); Mengistie Debasu, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 369 days.

(21) Appl. No.: 17/838,440

(22) Filed: Jun. 13, 2022

(65) Prior Publication Data
US 2023/0402276 A1 Dec. 14, 2023

(51) Int. Cl.
*H01L 21/02* (2006.01)
*C23G 1/10* (2006.01)

(52) U.S. Cl.
CPC ............ *H01L 21/0206* (2013.01); *C23G 1/10* (2013.01)

(58) Field of Classification Search
None
See application file for complete search history.

(56) References Cited

U.S. PATENT DOCUMENTS

| | | | |
|---|---|---|---|
| 6,776,874 B2 | 8/2004 | Kobayashi et al. | |
| 8,062,429 B2 | 11/2011 | Lee | |
| 8,771,804 B2 | 7/2014 | Dordi et al. | |
| 9,017,468 B2* | 4/2015 | Adamic ............... | C09D 11/322 |
| | | | 106/31.86 |
| 9,287,095 B2* | 3/2016 | Nguyen ............ | H01J 37/32807 |
| 9,309,598 B2* | 4/2016 | Wang ................ | H01J 37/32091 |
| 2002/0148720 A1* | 10/2002 | Arena-Foster .... | H01L 21/76877 |
| | | | 257/E21.585 |
| 2005/0191858 A1 | 9/2005 | Fukunaga et al. | |
| 2008/0026583 A1* | 1/2008 | Hardy ...................... | C09G 1/02 |
| | | | 438/693 |
| 2010/0105595 A1 | 4/2010 | Lee | |

(Continued)

FOREIGN PATENT DOCUMENTS

| | | | |
|---|---|---|---|
| EP | 0376252 A2 | 7/1990 | |
| JP | 2010053358 A * | 3/2010 | ........... C08G 61/123 |

(Continued)

OTHER PUBLICATIONS

International Search Report and the Written Opinion, PCT/US2023/018638, filed Apr. 14, 2023, Mailed Aug. 4, 2023, 12 pgs.

*Primary Examiner* — Michael Lebentritt
(74) *Attorney, Agent, or Firm* — Egan, Enders & Huston LLP.

(57) ABSTRACT

The present disclosure provides new processes and methods to pre-treat metal surfaces in the back end of line (BEOL) fabrication of integrated circuits (ICs). More specifically, the present disclosure provides selective, self-limiting processes and methods for stripping native oxide surface layers that may form on exposed metal surfaces during processing of ICs. The processes and methods disclosed herein utilize the fundamental concepts of metal complexation to provide a novel solution, which enables native oxide surface layers to be selectively removed from exposed metal films in a self-limiting manner. In particular, the disclosed processes and methods use complexing agents (e.g., ligands) to selectively dissolve native oxide surface layers, without significantly etching or removing the underlying metal film.

21 Claims, 9 Drawing Sheets

(56) References Cited

U.S. PATENT DOCUMENTS

| | | | |
|---|---|---|---|
| 2011/0214689 A1 | 9/2011 | Sakata | |
| 2012/0119202 A1* | 5/2012 | Keszler | B32B 9/005 |
| | | | 427/457 |
| 2014/0199497 A1 | 7/2014 | Spurlin et al. | |
| 2018/0272386 A1 | 9/2018 | McAlpin et al. | |
| 2019/0385828 A1 | 12/2019 | Singhal et al. | |
| 2020/0157693 A1* | 5/2020 | Abel | C23C 22/02 |
| 2020/0392405 A1 | 12/2020 | Kneer | |

FOREIGN PATENT DOCUMENTS

| | | | | |
|---|---|---|---|---|
| JP | 2013048252 A * | 3/2013 | | B82Y 10/00 |
| WO | WO-2008082448 A1 * | 7/2008 | | B01J 21/02 |

\* cited by examiner

RINSE

POST-TREATMENT METAL SURFACE

METHODS FOR SELECTIVE REMOVAL OF SURFACE OXIDES ON METAL FILMS

BACKGROUND

The present disclosure relates to semiconductor process technology for the fabrication of integrated circuits. More specifically, this invention relates to the processing of metals, metal surfaces, and metal-semiconductor interfaces during the fabrication of integrated circuits.

In the back end of line (BEOL) fabrication of integrated circuits (IC), metals are commonly used to electronically connect various active components in the circuit. Traditionally, copper (Cu) has been the dominant metal of choice, due to a suite of desirable electronic properties and processing feasibility. In some integrated circuits, copper interconnects in one layer may be coated with an ultrathin metal capping layer before proceeding to the next layer.

The metal capping layer may be used, for example, to mitigate reliability concerns (such as Cu electromigration or drift into the surrounding dielectric), which cause conductivity degradation and shorting in the subsequently formed device.

Metal capping layers often include an ultrathin metallic film of cobalt (Co) or ruthenium (Ru), preferably only a few nanometers (nm) thick, which is coated uniformly on the underlying copper metal line. In the case of cobalt metal caps on copper, the thickness of the cobalt capping layer is typically about 2 nm. Processing such a thin film is challenging given that cobalt, like most metals, tends to oxidize upon exposure to air or moisture. In practice, a native oxide surface layer always forms on the surface of the cobalt metal film. Since it is not conductive, the native oxide surface layer degrades the interface properties of the copper interconnect and poses the risk of incorporating ions (e.g., $Co^{2+/3+}$) into the capping layer, which leads to an even greater risk of electromigration and formation of defects. It is, therefore, desirable to use a cobalt surface pre-treatment to remove the native oxide surface layer, without etching the underlying metallic cobalt capping layer, before proceeding with subsequent processing steps (e.g., prior to forming a second metal layer).

In some applications, such as area-selective dielectric-on-dielectric (DoD) deposition, cobalt capped copper metal lines may be coated with a self-assembled monolayer (SAM) to passivate the metal pattern and prevent the metal pattern from being coated with dielectric material. Effective SAM formation requires cobalt surface pre-treatments to remove all or part of the native oxide that inherently forms on the cobalt metal surface during processing. In these applications, a selective process is desired that allows the native surface oxide to be removed without removing the underlying metallic cobalt capping layer.

Given the thickness of metal capping layers (e.g., a few nanometers), an ideal cobalt surface pre-treatment process is one which is self-limiting, i.e., it stops when all of the surface oxide is removed. However, current methods for pre-treating cobalt surfaces use acidic solutions (e.g., solutions containing dilute hydrofluoric acid and citric acid), which offer insufficient selectivity for cobalt metal versus native cobalt oxide. As a consequence, these pre-treatment methods often result in pitting and non-uniform thinning of the cobalt capping layer, which defeats its purpose.

A new method for pre-treating metal surfaces in BEOL fabrication of integrated circuits is, therefore, desired.

SUMMARY

The present disclosure provides new processes and methods to pre-treat metal surfaces in the back end of line (BEOL) fabrication of integrated circuits (ICs). More specifically, the present disclosure provides selective, self-limiting processes for stripping native oxide surface layers that may form on exposed metal surfaces during processing of ICs. The processes disclosed herein utilize the fundamental concepts of metal complexation to provide a novel solution, which enables native oxide surface layers to be selectively removed from exposed metal films in a self-limiting manner. In particular, and as described in more detail below, the disclosed processes use complexing agents (e.g., ligands) to selectively dissolve native oxide surface layers, without significantly etching or removing the underlying metal film.

According to one embodiment of the present disclosure, a novel wet method is provided for selectively removing surface oxides on metal films in a single step. In the present disclosure, a substrate having a native oxide surface layer formed on a metal film is exposed to a dissolution solution containing a complexing agent (e.g., a ligand) dissolved in a non-aqueous solvent. The ligand reacts with and binds to the native oxide surface layer to form a ligand-metal complex, which is soluble within and selectively dissolved by the non-aqueous solvent. Once the ligand-metal complex is selectively dissolved, the substrate may be rinsed to remove excess reactants and soluble species from the surface of the substrate. Absent further oxidation (e.g., unintended exposure to residual water, oxygen or air), the wet method disclosed herein selectively removes the native oxide surface layer, without etching the underlying metal film, thereby, leaving a metallic surface (or a ligand-bound passivating monolayer) on the metal film.

The processes and methods described herein for stripping native oxide surface layers provide various advantages over conventional methods used to remove surface oxides. For example, the processes and methods described herein are performed at low temperature (e.g., room temperature and above) using gentle chemistry (e.g., ligands dissolved in non-aqueous solvents), thus, providing minimal risk of damage to device components. The processes and methods disclosed herein are also inherently self-limiting by using a reactive dissolution chemistry containing ligands in non-aqueous solutions, where the ligands bind selectively to metal oxides, but not metals. Additionally, the disclosed processes and methods are fast, low cost, and do not require expensive vacuum tooling. Instead, the simplicity of the disclosed processes and methods allows for implementation on existing wet processing tools and integration with existing processing infrastructure in BEOL IC fabrication.

The techniques described herein may be used to strip or remove native oxide surface layers from a wide variety of metal films. In some embodiments, for example, the techniques described herein may be used for stripping transition metal oxides formed on transition metal films. Examples of transition metal films commonly used in IC fabrication, include are but not limited to, cobalt (Co), copper (Cu), ruthenium (Ru), tungsten (W), molybdenum (Mo), titanium (Ti), tantalum (Ta), platinum (Pt), nickel (Ni), rhodium (Rh), iridium (Ir), etc. The disclosed techniques may also be used for stripping metal oxides from other metal and semiconductor films, such as aluminum (Al), gold (Au), silicon (Si), germanium (Ge), etc.

As noted above and described further herein, the present disclosure provides various embodiments of methods that utilize a wet process to strip native oxide surface layers from metal films. The methods described herein may include a variety of process steps. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

According to a first embodiment, a method is provided herein for removing a native oxide formed on a surface of a metal film. The method may generally begin by receiving a substrate having a metal film exposed on a surface of the substrate, wherein a native oxide is formed on a surface of the metal film. The method may further include exposing the surface of the substrate to a dissolution solution comprising a ligand dissolved in a non-aqueous solvent, wherein the ligand complexes with the native oxide to form a ligand-metal complex, which is soluble within and selectively dissolved by the non-aqueous solvent. The method may further include rinsing the substrate to remove the dissolution solution and the dissolved ligand-metal complex from the surface of the substrate, thereby leaving a metallic surface or a ligand-bound passivating monolayer on the metal film.

A wide variety of ligands may be included within the dissolution solution, depending on the native oxide being removed. For example, the ligand included within the dissolution solution may be selected from a group consisting of β-diketonates, carboxylates, aminopolycarboxylates, oximes, and amines. In some embodiments, the dissolution solution may further include a base, which activates the ligand to accelerate complexation of the ligand with the native oxide. Regardless of the particular ligand used, the ligand included within the dissolution solution may react with and bind to the native oxide, but not to the metal film, thereby forming a self-limiting ligand-metal complex on the metal film.

A wide variety of non-aqueous solvents may also be included within the dissolution solution, including but not limited to, polar organic solvents such as alcohols (e.g. methanol, isopropanol, amyl alcohol), ketones (e.g. acetone, methyl ethyl ketone), acetates (e.g. ethyl acetate, amyl acetate), acetonitrile, dimethyl sulfoxide and n-methyl pyrrolidone. Regardless of the particular solvent used, the non-aqueous solvent included within the dissolution solution may be used to selectively dissolve the ligand-metal complex, while preventing reoxidation of the metallic surface once the ligand-metal complex is removed.

The method disclosed in the first embodiment may generally be used to remove native oxides that form on exposed surfaces of metal films during processing or via exposure to ambient environments. In some embodiments, the method disclosed in the first embodiment may be used to strip native oxides from relatively thin metal films. For example, a thickness of the metal film may be approximately 10 nm or less (and in some cases, 2 nm or less), and the method may be used to strip a native oxide having a thickness of 5 nm or less (and in some cases, 1 nm or less) from the surface of the metal film. In some embodiments, the steps of exposing the surface of the substrate to a dissolution solution and rinsing the substrate may remove the native oxide formed on the surface of the metal film without removing or significantly etching the metal film.

The method disclosed in the first embodiment may be used to remove native oxides from a wide variety of metal films. In some embodiments, for example, the method may be used to remove native oxides formed on a wide variety of transition metal films, such as but not limited to, cobalt (Co), copper (Cu), ruthenium (Ru), tungsten (W), molybdenum (Mo), titanium (Ti), tantalum (Ta), platinum (Pt), nickel (Ni), rhodium (Rh) and iridium (Ir) metal films. The method may also be used to remove metal oxides from other metal and semiconductor films, such as aluminum (Al), gold (Au), silicon (Si), germanium (Ge), etc.

In some embodiments, the method disclosed in the first embodiment may be performed at low temperatures. For example, the steps of exposing the surface of the substrate to a dissolution solution and rinsing the substrate may be performed at a temperature ranging between 20° C. and 55° C.

According to a second embodiment, another method is provided herein for removing a native oxide formed on a surface of a metal film. The method may generally begin by receiving a substrate having a metal film exposed on a surface of the substrate, wherein a native oxide is formed on the surface of the metal film. Next, the method may include exposing the surface of the substrate to an oxidizing agent to further oxidize the native oxide and form a metal oxide surface layer or a metal hydroxide surface layer, and subsequently exposing the surface of the substrate to a dissolution solution comprising a ligand dissolved in a non-aqueous solvent. The ligand included within the dissolution solution may react with and bind to the metal oxide surface layer or the metal hydroxide surface layer to form a ligand-metal complex, which is soluble within and selectively dissolved by the non-aqueous solvent. Next, the method may include rinsing the substrate to remove the dissolution solution and the ligand-metal complex from the surface of the substrate. By exposing the surface of the substrate to the oxidizing agent, exposing the surface of the substrate to the dissolution solution and rinsing the substrate, as described above, the method may selectively remove the native oxide formed on the surface of the metal film without removing the metal film.

The surface of the substrate may be exposed to a wide variety of oxidizing agents. In some embodiments, for example, the oxidizing agent may be selected from a group consisting of deionized water, air, hydrogen peroxide and ammonium hydroxide. In one embodiment, the surface of the substrate may be exposed to deionized water to further oxidize the native oxide and form a metal hydroxide surface layer on the surface of the metal film. In such embodiments, the metal hydroxide surface layer may dissolve within the non-aqueous solvent easier than the native oxide.

The surface of the substrate may also be exposed to a wide variety of dissolution solutions. In some embodiments, exposure to the dissolution solution may result in the formation of a self-limiting ligand-metal complex on the metal film. To form a self-limiting ligand-metal complex, the ligand included within the dissolution must react with and bind to the native oxide. However, the ligand included within the dissolution does not react with or bind to the metal film after the ligand-metal complex is dissolved within the non-aqueous solvent.

In some embodiments, said exposing the surface of the substrate to the dissolution solution and said rinsing the substrate may leave a metallic surface or a ligand-bound passivating monolayer on the metal film and may prevent further oxidation of the metal film. In some embodiments, said rinsing the substrate may include exposing the substrate to a second non-aqueous solvent, which may be the same as (or different from) the non-aqueous solvent used in the dissolution solution. The non-aqueous solvents utilized in the dissolution and rinsing steps do not include oxidizing agents, and thus, prevent intentional oxidation of the metallic surface left on the metal film once the native oxide is selectively removed.

According to a third embodiment, a method is provided herein for stripping a native oxide from a cobalt metal film. The method may generally begin by receiving a substrate having the cobalt metal film exposed on a surface of the substrate, wherein the native oxide is formed on the cobalt metal film. The method may also include exposing the surface of the substrate to a dissolution solution comprising a ligand dissolved in a non-aqueous solvent, wherein the ligand reacts with and binds to the native oxide to form a ligand-metal complex, which is self-limiting and selectively dissolved with the non-aqueous solvent. The method may further include rinsing the substrate to remove the dissolution solution and the ligand-metal complex from the surface of the substrate. By exposing the surface of the substrate to the dissolution solution and rinsing the substrate, as described above, the method may strip the native oxide from the cobalt metal film without removing the cobalt metal film.

In some embodiments, the method disclosed in the third embodiment may further include exposing the surface of the substrate to an oxidizing agent to convert the native oxide to a cobalt oxide surface layer or a cobalt hydroxide surface layer before exposing the surface of the substrate to the dissolution solution. In such embodiments, the ligand contained within the dissolution solution may react with and bind to the cobalt oxide surface layer or the cobalt hydroxide surface layer to form the ligand-metal complex. The surface of the substrate may be exposed to a wide variety of oxidizing agents. In one embodiment, the surface of the substrate may be exposed to deionized water to further oxidize the native oxide and form a cobalt hydroxide surface layer on the surface of the metal film. In some embodiments, the cobalt hydroxide surface layer may dissolve within the non-aqueous solvent easier than the native oxide.

A wide variety of ligands and non-aqueous solvents may be included within the dissolution to selectively dissolve the native oxide (or optionally, the cobalt oxide surface layer or the cobalt hydroxide surface layer). In one embodiment, the dissolution solution may include acetylacetonate (i.e., the ligand) dissolved in methanol (i.e., the non-aqueous solvent). In some embodiments, the dissolution solution may further include a base, which deprotonates the ligand to accelerate complexation of the ligand with the native oxide. In such embodiments, the base may be selected from a group consisting of quaternary ammonium hydroxides (e.g., tetrabuthyl ammonium hydroxide (TBAH), tetramethyl ammonium hydroxide (TMAH)), nitrogenous bases (e.g., trimethylamine, piperidine) and phosphines (e.g., triphenylphosphine). In one embodiment, the base may be tetrabuthyl ammonium hydroxide (TBAH).

In another embodiment, the dissolution solution may include glacial acetic acid (GAC) (i.e., the ligand) dissolved in isopropyl alcohol (IPA) (i.e., the non-aqueous solvent). In some embodiments, a concentration of the GAC in the IPA may range between 0-100%. In one example embodiment, the concentration of GAC in IPA may be approximately 1%.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

The present disclosure provides new processes and methods to pre-treat metal surfaces in the back end of line (BEOL) fabrication of integrated circuits (ICs). More specifically, the present disclosure provides selective, self-limiting processes for stripping native oxide surface layers that may form on exposed metal surfaces during processing of ICs. The processes disclosed herein utilize the fundamental concepts of metal complexation to provide a novel solution, which enables native oxide surface layers to be selectively removed from exposed metal films in a self-limiting manner. In particular, and as described in more detail below, the disclosed processes use complexing agents (e.g., ligands) to selectively dissolve native oxide surface layers, without significantly etching or removing the underlying metal film.

According to one embodiment of the present disclosure, a novel wet method is provided for selectively removing surface oxides on metal films in a single step. In the present disclosure, a substrate having a native oxide surface layer formed on a metal film is exposed to a dissolution solution containing a complexing agent (e.g., a ligand) dissolved in a non-aqueous solvent. The ligand reacts with and binds to the native oxide surface layer to form a ligand-metal complex, which is soluble within and selectively dissolved by the non-aqueous solvent. Once the ligand-metal complex is selectively dissolved, the substrate may be rinsed to remove excess reactants and soluble species from the surface of the substrate. Absent further oxidation (e.g., unintended exposure to residual water, oxygen or air), the wet method disclosed herein selectively removes the native oxide surface layer, without etching the underlying metal film, thereby, leaving a metallic surface or a ligand-bound passivating monolayer on the metal film.

Figure 1:
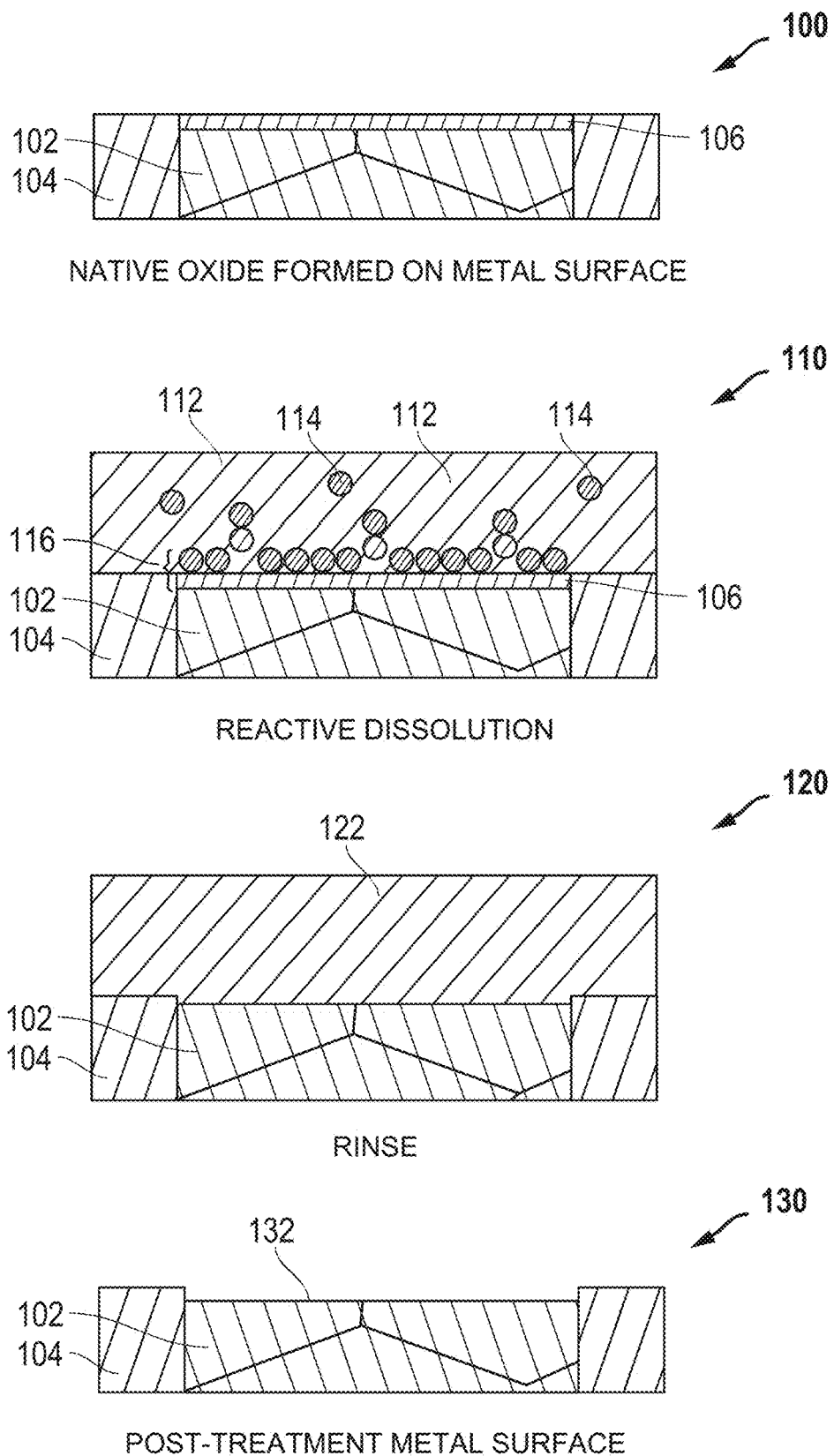
FIG. 1 illustrates one embodiment of a process for removing a native oxide surface layer from a metal film.

FIG. 1 illustrates one embodiment of a wet process that can be used to remove a native oxide surface layer from a metal film in accordance with the present disclosure. The wet process shown in FIG. 1 may generally begin by receiving a substrate having a metal film 102 surrounded by a dielectric material 104 in process step 100. In some embodiments, the metal film 102 may be a metal capping layer formed on an underlying metal interconnect or a metal liner formed on an underlying metal line. For example, the metal capping layer or metal liner may include a relatively thin (e.g., 10 nm or less) metallic film of cobalt (Co), ruthenium (Ru) or another transition metal, which is coated uniformly on the underlying metal interconnect or metal line. In some cases the thin layer or liner may be 2 nm or less.

As shown in FIG. 1, a native oxide 106 is formed on the metal film 102. The native oxide 106 may be formed on the metal film 102 during a previous process step(s) or via exposure to air or moisture in the ambient environment. Since it is not conductive, the native oxide 106 layer degrades the interface properties of the metal interconnect or metal line, and poses the risk of incorporating ions (e.g., $Co^{2+/3+}$) into the metal capping layer, which leads to an even greater risk of electromigration and formation of defects. For these reasons, it is desirable to remove the native oxide 106 without etching the underlying metal film 102.

In process step 110, the surface of the substrate is exposed to a dissolution solution containing a complexing agent (e.g., a ligand) 114 dissolved in a first non-aqueous solvent 112. When the native oxide 106 comes in contact with the dissolution solution, the complexing agent (ligand) 114 reacts with and binds to the native oxide 106 to form a ligand-metal complex 116, which is soluble within and selectively dissolved by the first non-aqueous solvent 112. In some embodiments, the dissolution solution may further include a base, which deprotonates (i.e., activates) the ligand to accelerate complexation of the ligand with the native oxide 106.

In process step 120, the substrate is rinsed with a second non-aqueous solvent 122 to remove the dissolution solution and the ligand-metal complex 116 from the surface of the substrate, which leaves a metallic surface 132 (or a ligand-bound passivating monolayer) on the metal film 102 in process step 130. The second non-aqueous solvent 122 used in process step 120 may be the same as (or different from) the first non-aqueous solvent 112 used in process step 110.

The wet process shown in FIG. 1 utilizes a reactive dissolution method to selectively remove the native oxide 106 without removing (or significantly etching) the underlying metal film 102 or the dielectric material 104 surrounding the metal film 102. The wet process shown in FIG. 1 achieves selective removal of the native oxide 106 by utilizing a ligand that reacts with and binds to the native oxide 106, but not to the metal film 102. This enables a ligand-metal complex 116 to be formed on the metal film 102 that is self-limiting, i.e., the complexation reaction stops when the ligand-metal complex 116 is selectively removed from the surface of the metal film 102 and the metallic surface 132 is exposed. A wide variety of ligands may be utilized within the dissolution solution, as discussed further in more detail below. In addition to removing the ligand-metal complex 116 from the metal film 102, the non-aqueous solvents (112 and 122) used within process steps 110 and 120 prevent further oxidation of the metallic surface 132 of the metal film 102 by avoiding the use of oxidizing agents. A wide variety of non-aqueous solvents may be used within the dissolution and rinse solutions, as discussed further in more detail below.

Figure 2:
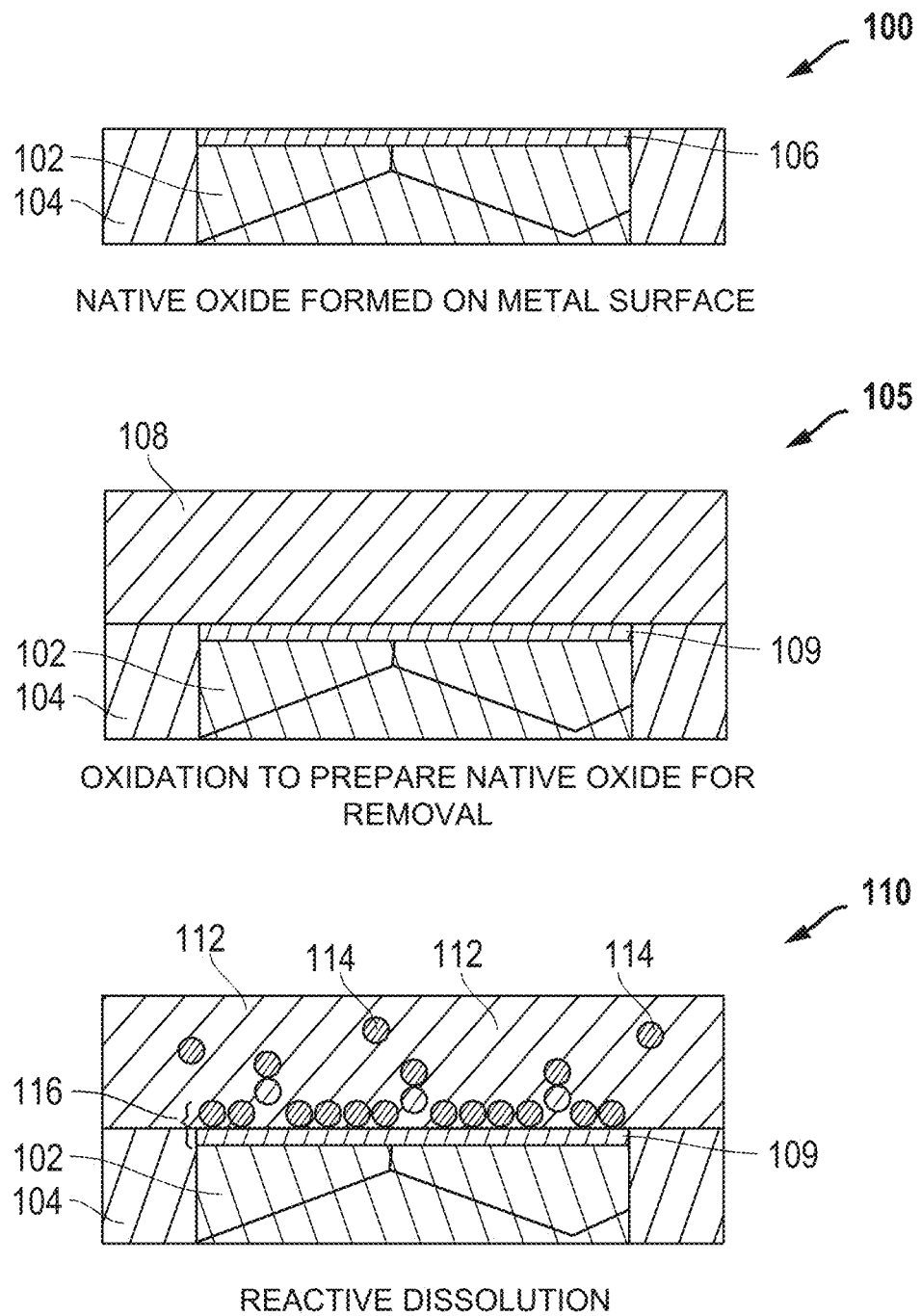
FIG. 2 illustrates another embodiment of a process for removing a native oxide surface layer from a metal film.
Figure 2:
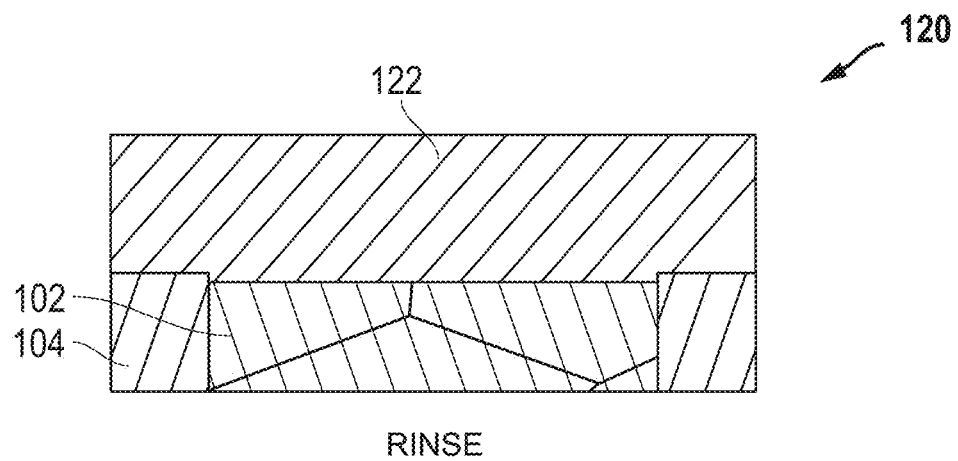
Figure 2:
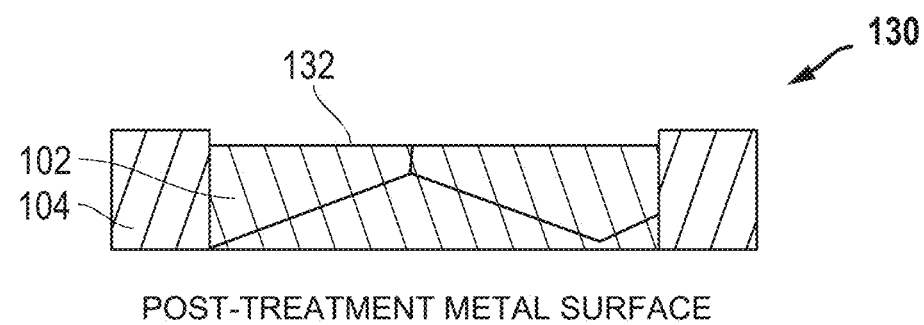

FIG. 2 illustrates another embodiment of a wet process that can be used to remove a native oxide surface layer from a metal film in accordance with the present disclosure. The process shown in FIG. 2 is similar to that shown in FIG. 1. In addition to process steps 100, 110, 120 and 130, as described above, the wet process shown in FIG. 2 includes an additional process step 105 after the substrate is received in process step 100 and before the substrate is exposed to the dissolution solution in process step 110. It is noted that the process step 105 shown in FIG. 2 is optional and may or may not be used to remove the native oxide 106 from the metal film 102.

In process step 105, the surface of the substrate is exposed to an oxidizing agent 108 to further oxidize the native oxide 106 and form a metal oxide surface layer (or a metal hydroxide surface layer) 109 on the metal film 102 before the surface of the substrate is exposed to the dissolution solution in process step 110. A wide variety of oxidizing agents 108 may be used in process step 105 to convert the native oxide 106 to a metal oxide surface layer (or a metal hydroxide surface layer) 109. Examples of oxidizing agents 108 that may be used in process step 105 are discussed further in more detail below. When the surface of the substrate is subsequently exposed to the dissolution solution in process step 110, the complexing agent (ligand) 114 reacts with and binds to the metal oxide surface layer (or the metal hydroxide surface layer) 109 to form a ligand-metal complex 116, which is soluble within and selectively dissolved by the first non-aqueous solvent 112. In some embodiments, the metal oxide surface layer (or the metal hydroxide surface layer) 109 may be easier to remove from the metal film 102 than the native oxide 106.

Unlike the wet process shown in FIG. 1, the wet process shown in FIG. 2 utilizes oxidation (in process step 105) to prepare the native oxide 106 layer for removal in the subsequently performed dissolution step (in process step 110). In some embodiments, the metal oxide surface layer (or the metal hydroxide surface layer) 109 formed during process step 105 may dissolve within the non-aqueous solvent 112 easier than the native oxide 106 originally formed on the surface of the metal film 102. In one example embodiment, process step 105 may add hydroxide atoms to the native oxide 106 layer, which are more soluble within the dissolution solution, and thus, easier to remove during the process step 110.

The wet processes shown in FIGS. 1-2 can be used to strip native oxide surface layers from a wide variety of metal films. In some embodiments, the processes shown in FIGS. 1-2 may be used for stripping native oxides formed on a wide variety of transition metal films, such as but not limited to, cobalt (Co), copper (Cu), ruthenium (Ru), tungsten (W), molybdenum (Mo), titanium (Ti), tantalum (Ta), platinum (Pt), nickel (Ni), rhodium (Rh) and iridium (Ir) metal films. In addition to transition metals, the wet processes disclosed herein may also be used for stripping native oxides from other metal and semiconductor films, such as aluminum (Al), gold (Au), silicon (Si), germanium (Ge), etc. Example etch chemistries for selectively removing native oxides from cobalt metal films using the techniques disclosed herein are discussed in more detail below.

As noted above, the wet processes shown in FIGS. 1-2 utilize a dissolution solution containing a complexing agent (e.g., a ligand) 114 dissolved in a first non-aqueous solvent 112 to selectively remove a native oxide 106 and leave a metallic surface 132 (or a ligand-bound passivating monolayer) on a metal film 102, all without significantly etching the metal film 102. The complexing agent 114 drives the dissolution of the native oxide 106 by replacing the oxo- or hydroxo-ligands in the native oxide 106. In the absence of oxidation, the wet process stops on the metallic surface 132, since metallic atoms will not form complexes with the complexing agent 114 used in the dissolution solution. The choice of ligand and solvent are important to achieve etching of, and selectivity to, the native oxide 106. For example, the ligand-metal complex 116 should be soluble in the first non-aqueous solvent 112 to effect dissolution. On the other hand, the ligand should only react with the native oxide 106 and not with the metal atoms of the metal film 102. Examples of ligands that may be used in the wet processes disclosed herein include, but are not limited to, β-diketonates, carboxylates, aminopolycarboxylates, oximes, and amines. Particular ligands selected for use within the dissolution solution may generally depend on the native oxide 106 being removed.

In some embodiments, the dissolution solution may further include a base, which deprotonates (i.e., activates) the ligand to accelerate complexation of the ligand with the native oxide 106. A wide variety of bases may be included within the dissolution solution, such as but not limited to, quaternary ammonium hydroxides (e.g., tetrabuthyl ammonium hydroxide (TBAH), tetramethyl ammonium hydroxide (TMAH)), nitrogenous bases (e.g., trimethylamine, piperidine), phosphines (e.g., triphenylphosphine), etc. In one embodiment, TBAH may be utilized within the dissolution solution to activate the ligand.

In addition to dissolving and removing the ligand-metal complex 116, the non-aqueous solvents (112 and 122) utilized within the dissolution and rinse solutions prevent reoxidation of the metallic surface 132 once the ligand-metal complex 116 is selectively removed. Examples of non-aqueous solvents 112 that may be used for reactive dissolution of native oxide and metal oxide/hydroxide surface layers include, but are not limited to, polar organic solvents such as alcohols (e.g., methanol, isopropanol, amyl alcohol), ketones (e.g., acetone, methyl ethyl ketone), acetates (e.g., ethyl acetate, amyl acetate), acetonitrile, dimethyl sulfoxide and n-methyl pyrrolidone. Additionally, some ligands are liquid under typical reaction conditions and can serve dual purpose as both ligand and solvent. This is the case with acetic acid and acetylacetone. Examples of non-aqueous solvents 122 that may be used to rinse the substrate include, but are not limited to, all of the solvents listed for the reactive dissolution step.

In some embodiments, an oxidizing agent 108 may be used to convert the native oxide 106 to a metal oxide surface layer (or a metal hydroxide surface layer) 109 prior to exposing the surface of the substrate to the dissolution solution, as described above in reference to FIG. 2. A wide variety of oxidizing agents 108 may be used including, but not limited to, deionized water, air, hydrogen peroxide ($H_2O_2$), ammonium hydroxide ($NH_4OH$), etc. In one embodiment, the surface of the substrate may be exposed to deionized water in process step 105 to further oxidize the native oxide 106 and form a metal hydroxide surface layer 109 on the surface of the metal film 102. As noted above, the metal hydroxide surface layer 109 may dissolve within the first non-aqueous solvent 112 easier than the native oxide 106.

In some embodiments, the wet processes shown in FIGS. 1-2 may be used to provide highly selective, self-limiting removal of native oxides formed on cobalt (Co) metal films. However, it should be understood that the wet processes disclosed herein are not strictly limited to cobalt and can be used to provide highly selective, self-limiting removal of native oxides formed on other metal and semiconductor films. For the case of cobalt (Co), two solvent/ligand systems are described in the following embodiments with related experimental results.

According to a first embodiment, the wet processes shown in FIGS. 1-2 may be used to selectively remove native oxides formed on cobalt metal films by exposing the surface of the substrate in process step 110 to a dissolution solution containing a β-diketonate ligand dissolved in alcohol. Examples of β-diketonate ligands include, but are not limited to, acetylacetonate (ACAC) and hexafluoroacetylacetone (HFAC), which form strong bonds with metal ions such as $C^{2+/3+}$.

In one example of the first embodiment, the dissolution solution utilized in process step 110 may include acetylacetonate (ACAC) dissolved in methanol. In this example embodiment, the acetylacetonate (ACAC) ligand dissolved in methanol drives the self-limiting removal of native oxide formed on the cobalt metal film at low temperatures (e.g., near room temperature and above). Once the native oxide is removed, a fresh metallic surface is exposed, which is inactive toward the acetylacetonate ligand absent any further oxidation. In some embodiments, a base such as TBAH may be used to accelerate the complexation of the acetylacetonate ligand with the native oxide by deprotonating (i.e., activating) the acetylacetonate ligand.

This wet removal method described above provides a robust process for selective, self-limiting removal of native oxides formed on cobalt metal films. A typical process in accordance with the first embodiment may utilize a dissolution solution containing 1-25% of acetylacetonate (ACAC) and 50 mM TBAH dissolved in methanol, followed by a methanol or IPA rinse. Higher concentrations of acetylacetonate (ACAC) may be used, thought it may not be necessary. In such a process, native oxide can be selectively removed from the surface of the cobalt metal film by dipping and/or rinsing the surface of the substrate in the dissolution and rinse solutions. A typical processing temperature can range between 20° C. and 55° C.

Etching experiments were conducted on coupons cut from a 300 mm silicon wafer with various thicknesses of physical vapor deposition (PVD) cobalt deposited on one side. Native oxide formation occurred on the cobalt metal film due to ambient exposure. An etch recipe including a 30 second dip in 25% ACAC and 50 mM TBAH dissolved in methanol, followed by a methanol rinse and compressed air blow dry, was used to selectively remove the native oxide from the surface of the cobalt metal film. The process was performed at 55° C.

Figure 3:
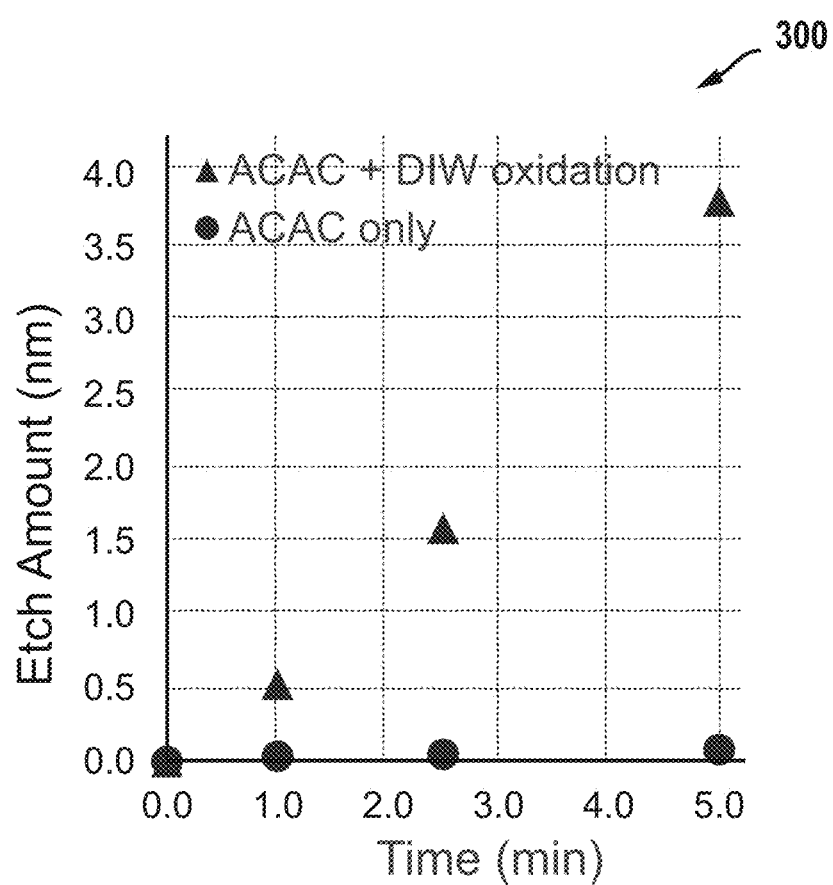
FIG. 3 is a graph illustrating etch amounts (expressed in nm) that may be achieved when etching a cobalt metal film having a native oxide surface layer using 25% ACAC dissolved in methanol at 55° C. with and without intentional oxidation.

Two etch experiments were performed to evaluate the selectivity between the native oxide and cobalt metal etch using the etch recipe described above. The results of such experiments are depicted in the graph 300 shown in FIG. 3. In a first experiment (circles), a cobalt metal film with native oxide formation was exposed to the dissolution solution described above for a prolonged period of time (e.g., 5 minutes) without intentional oxidation. In this experiment, only the native oxide was removed and no significant change in the cobalt metal film thickness was observed.

In a second experiment (triangles), a cyclic process was employed to assess the selectivity of acetylacetonate (ACAC) to the native oxide etch. For this experiment, an intentional oxidation step was incorporated within the etch recipe after the dissolution step to allow for replication of the native oxide before the process steps were repeated. Oxidation was performed by dipping a substrate comprising the cobalt metal film in deionized water for several seconds (e.g., 30 seconds) at 55° C. In this experiment, the cobalt metal film was etched during each cycle, resulting in an etch amount per cycle (i.e., an etch rate). The experiments prove that a dissolution solution containing 25% ACAC and 50 mM TBAH dissolved in methanol does not etch the cobalt metal film in the absence of oxidation within the time period of the experiments.

Comparing cobalt etch rates with and without intentional oxidation show that any etching achieved is associated with the native oxide etch, indirectly confirming the self-limiting native oxide removal behavior. The experimental results further show that a dissolution solution containing 25% of ACAC in methanol is at least 70× more selective toward etching native oxide than cobalt metal (i.e., the ratio between the etch rate of native oxide and the etch rate of cobalt metal). In theory, higher selectivity is possible by controlling for unwanted oxidation.

According to a second embodiment, the wet processes shown in FIGS. 1-2 may be used to selectively remove native oxides formed on cobalt metal films by exposing the surface of the substrate in process step 110 to a dissolution solution containing a carboxylate (such as acetic acid) dissolved in an alcohol (such as isopropyl alcohol, IPA). In one example of the second embodiment, the dissolution solution used in process step 110 was prepared by diluting glacial acetic acid (GAC). A high concentration of GAC continuously etches cobalt at a high etch rate, presumably due to the presence of moisture and dissolved oxygen in the GAC solution. To avoid spontaneous etching of cobalt, various concentrations of GAC were diluted by IPA, which allowed for reducing the etch rate down to near zero for very dilute GAC solutions.

Figure 4A:
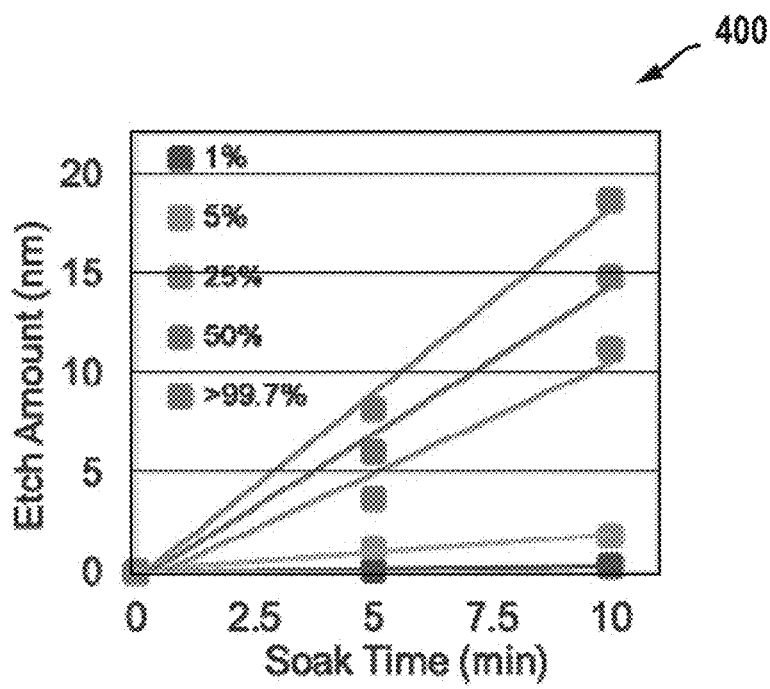
FIG. 4A is a graph illustrating exemplary etch amounts (expressed in nanometers, nm) that may be achieved when etching a native oxide formed on a cobalt metal film using different concentrations of acetic acid in isopropyl alcohol (IPA) at 35° C.
Figure 4B:
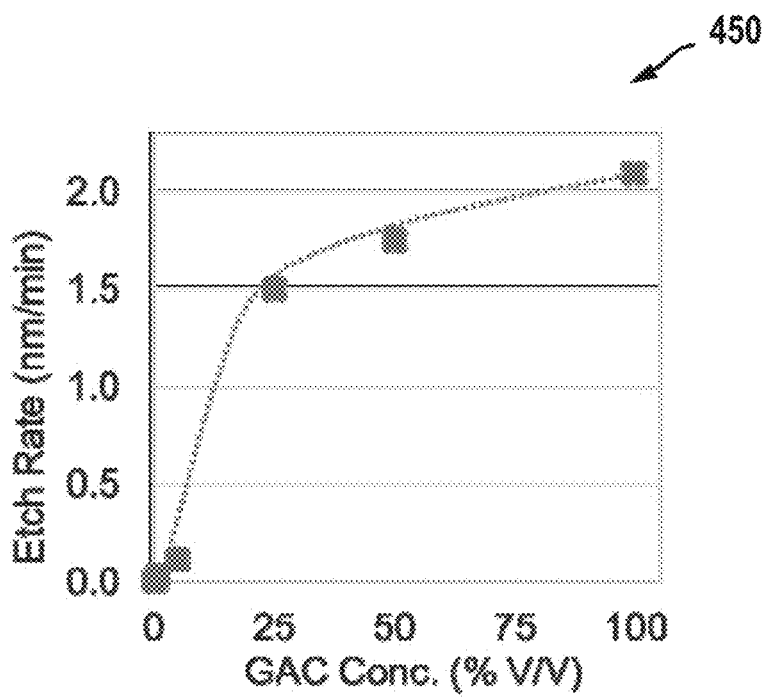
FIG. 4B is a graph illustrating the dependence of etch rate (expressed in nm/minute) on acetic acid concentration.

The graph 400 shown in FIG. 4A illustrates various etch amounts (expressed in nm) that may be achieved when etching cobalt using different concentrations of acetic acid (e.g., 1%, 5%, 25%, 50% and >99%) in isopropyl alcohol (IPA) at 35° C. The graph 450 shown in FIG. 4B illustrates the dependence of etch rate (expressed in nm/minute) on acetic acid concentration. As shown in FIGS. 4A and 4B, the cobalt etch rate is high for GAC concentrations of 25% or more. However, very little etching of cobalt occurs at 5% GAC dissolved in IPA. Below 1% GAC in IPA, the cobalt spontaneous etch rate is negligible. At this concentration, acetic acid ligands selectively dissolve native oxides from the cobalt metal film, without significantly etching the cobalt metal film, similar to the first embodiment that used ACAC ligands dissolved in methanol.

This wet removal method described above provides another robust process for selective, self-limiting removal of native oxides formed on cobalt metal films. A typical process in accordance with the second embodiment may utilize a dissolution solution containing 0-5% of GAC dissolved in IPA, followed by an IPA rinse. Like the previous process, native oxide can be selectively removed from the surface of the cobalt metal film by dipping and/or rinsing the surface of the substrate in the dissolution and rinse solutions. The processing temperature of the dissolution and rinse solutions may be generally dependent on the solvent used therein. For example, the processing temperature may range between −89° C. and 82° C. when using IPA, and may range between 19° C. and 190° C. when using DMSO. In some embodiments, however, near room temperature processing may be desired. In such embodiments, a typical processing temperature can range between 20° C.-55° C.

Etching experiments were conducted on coupons cut from a 300 mm silicon wafer with various thicknesses of physical vapor deposition (PVD) cobalt deposited on one side. Native oxide formation occurred on the cobalt metal film due to ambient exposure. An etch recipe including a 30 second dip in 1% of GAC dissolved in IPA, followed by an IPA rinse and nitrogen ($N_2$) blow dry, was used to selectively remove the native oxide from the surface of the cobalt metal film. The process was performed at 35° C.

Figure 5:
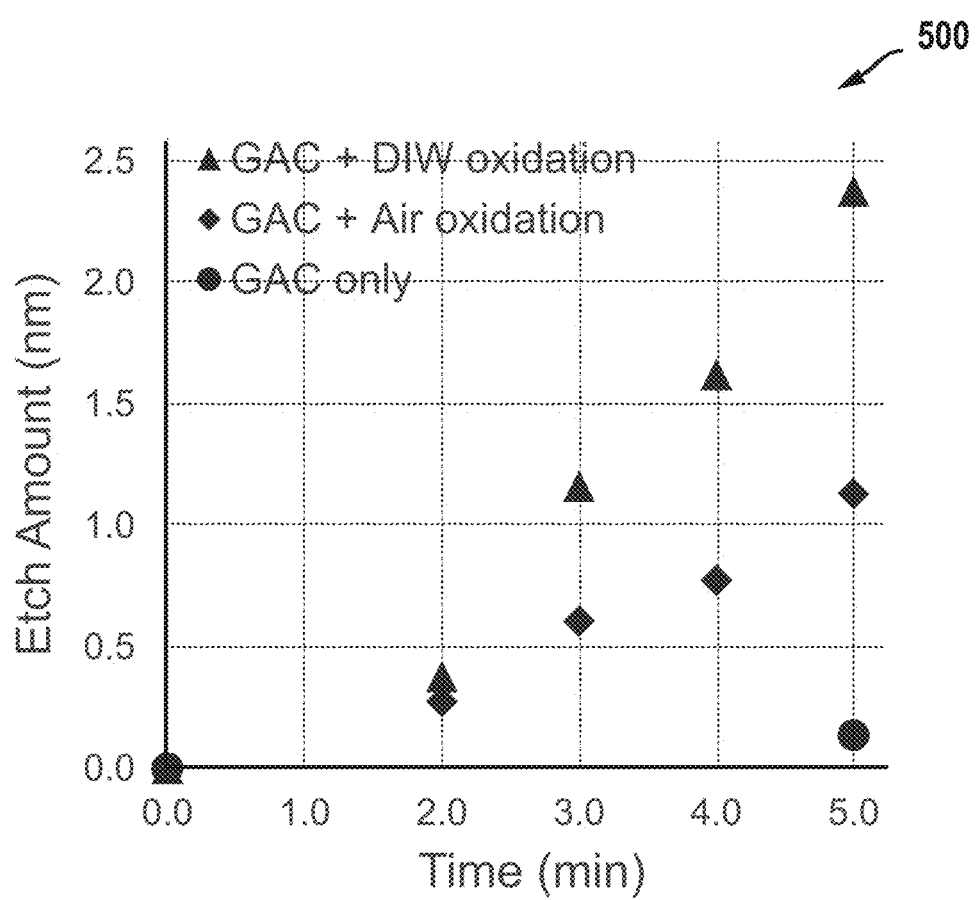
FIG. 5 is a graph illustrating etch amounts (expressed in nm) that may be achieved when etching a cobalt metal film having a native oxide surface layer using 1% glacial acetic acid (GAC) dissolved in IPA at 35° C. with and without intentional oxidation.

Three etch experiments were performed to evaluate the selectivity between the native oxide and cobalt metal etch using the etch recipe described above. The results of such experiments are depicted in the graph 500 shown in FIG. 5. In a first experiment (circles), a cobalt metal film with native oxide formation was exposed to the dissolution solution described above for a prolonged period of time (e.g., 5 minutes) without intentional oxidation. In the first experiment, only the native oxide was removed and no significant change in the cobalt metal film thickness was observed.

In a second experiment (diamonds), an intentional oxidation step was incorporated within the etch recipe after the dissolution step by exposing the cobalt metal film to air, which allowed for replication of the native oxide. In this experiment, exposure to air enhanced the etch rate of the cobalt metal film, due to reoccurring native oxide formation on the cobalt surface.

In a third experiment (triangles), a cyclic process was employed to assess the selectivity of glacial acetic acid (GAC) to the native oxide etch. For this experiment, an intentional oxidation step was incorporated within the etch recipe after the dissolution step to allow for replication of the native oxide before the process steps were repeated. In the third experiment, oxidation was performed by dipping the substrate comprising the cobalt metal film in deionized water for several seconds (e.g., 30 seconds) at 35° C. Like the previous experiment, exposure to water enhanced the etch rate of the cobalt metal film, due to reoccurring native oxide formation on the cobalt surface. For the water treated coupon, surface hydroxylation may accelerate the dissolution kinetics of the native oxide.

The experiments discussed above prove that a dissolution solution containing 1% of GAC dissolved in IPA does not etch the cobalt metal film in the absence of oxidation (air or water) within the time period of the experiments. Comparing cobalt etch rates with and without intentional oxidation, any etching achieved is associated with the native oxide etch, indirectly confirming the self-limiting native oxide removal behavior. The experimental results further show that a dissolution solution containing 1% of GAC in IPA is at least 10× and 25× more selective toward etching native oxide than cobalt metal with air and deionized water oxidations, respectively. In theory, higher selectivity is possible by controlling for unwanted oxidation.

Figure 6:
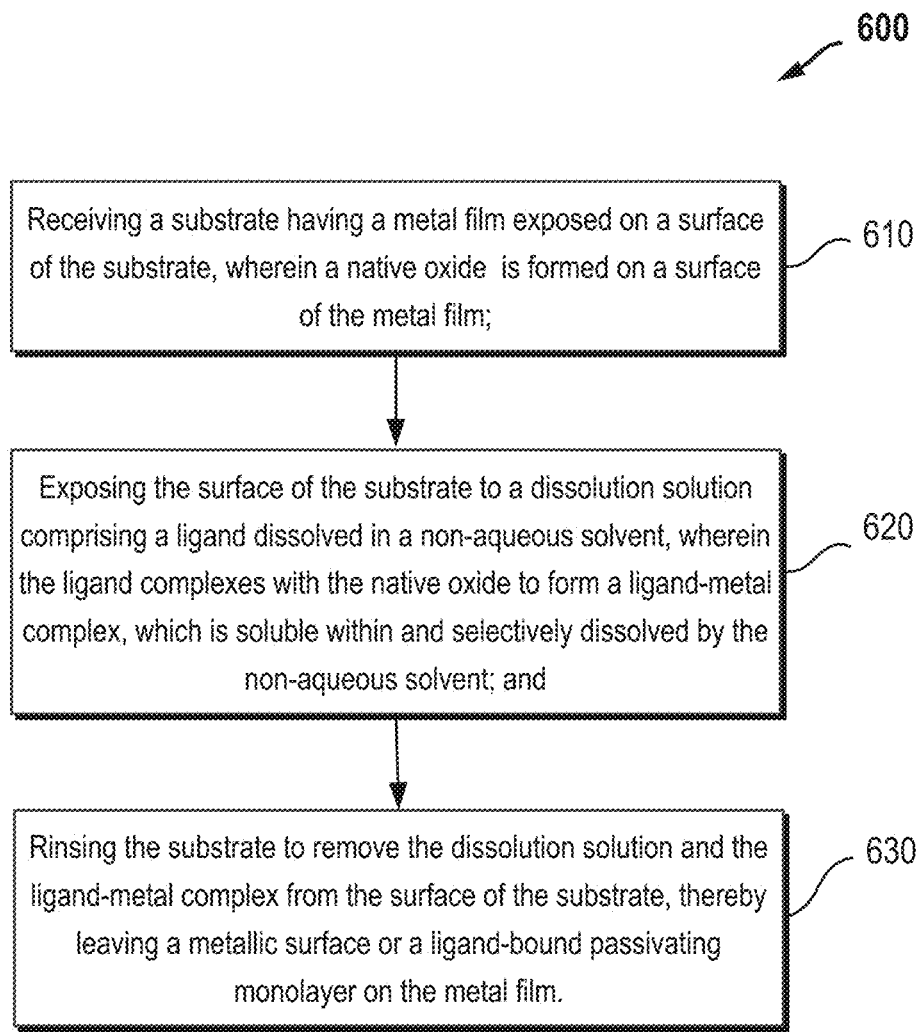
FIG. 6 is a flowchart diagram illustrating one embodiment of a method that utilizes the techniques described herein.
Figure 7:
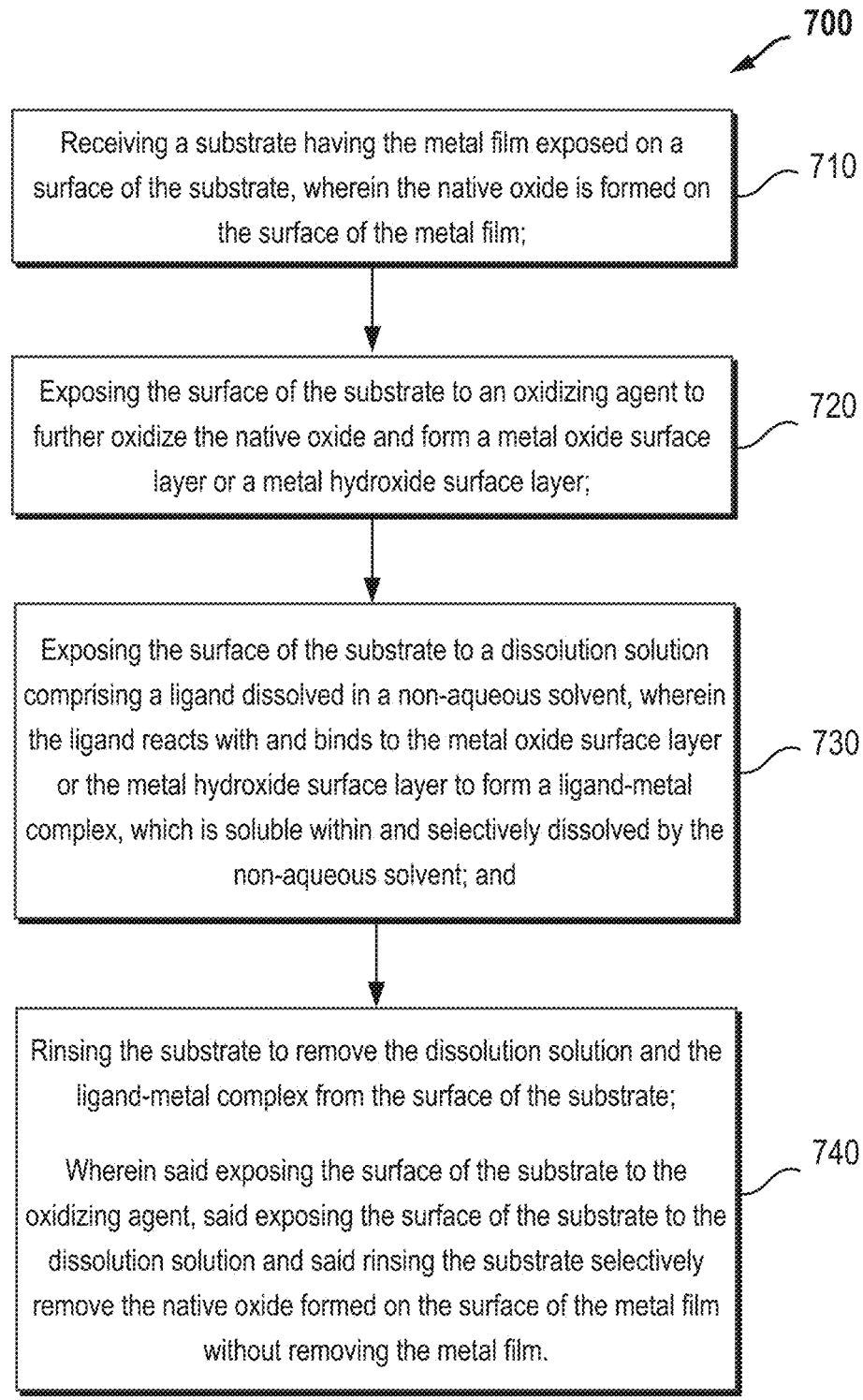
FIG. 7 is a flowchart diagram illustrating another embodiment of a method that utilizes the techniques described herein.
Figure 8:
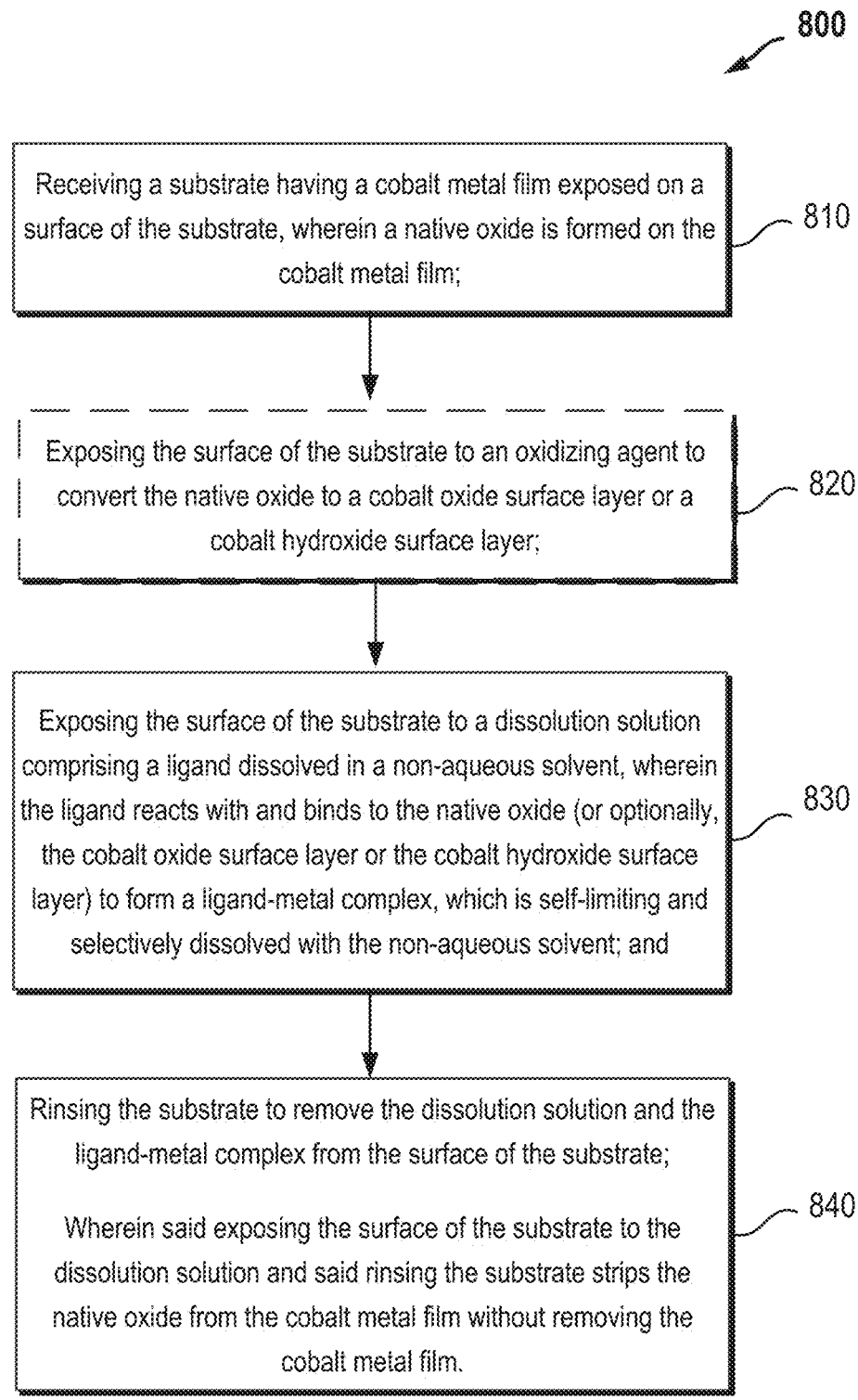
FIG. 8 is a flowchart diagram illustrating yet another embodiment of a method that utilizes the techniques described herein.

FIGS. 6-8 illustrate exemplary methods that use the processing techniques described herein. It will be recognized that the embodiments of FIGS. 6-8 are merely exemplary and additional methods may utilize the techniques described herein. Further, additional processing steps may be added to the methods shown in the FIGS. 6-8 as the steps described are not intended to be exclusive. Moreover, the order of the steps is not limited to the order shown in the figures as different orders may occur and/or various steps may be performed in combination or at the same time.

FIG. 6 illustrates one embodiment of a method 600 for removing a native oxide formed on a surface of a metal film. The method 600 shown in FIG. 6 may generally begin by receiving a substrate having a metal film exposed on a surface of the substrate, wherein a native oxide is formed on a surface of the metal film (in step 610). The method 600 may further include exposing the surface of the substrate to a dissolution solution comprising a ligand dissolved in a non-aqueous solvent (in step 620). When the native oxide is exposed to the dissolution solution in step 620, the ligand complexes with the native oxide to form a ligand-metal complex, which is soluble within and selectively dissolved by the non-aqueous solvent. Once the ligand-metal complex is dissolved, the method 600 may include rinsing the substrate to remove the dissolution solution and the dissolved ligand-metal complex from the surface of the substrate, thereby leaving a metallic surface or a ligand-bound passivating monolayer on the metal film (in step 630).

The method 600 shown in FIG. 6 may be used to remove native oxides that form on exposed surfaces of metal films during processing or via exposure to ambient environments. In some embodiments, the method 600 shown in FIG. 6 may be used to strip native oxides from ultrathin metal films. For example, a thickness of the metal film may be approximately 10 nm or less and in some cases even 2 nm or less, and the method 600 may be used to strip a native oxide having a thickness of 5 nm or less and in some cases 1 nm or less from the surface of the metal film. In some embodiments, the steps of exposing the surface of the substrate to a dissolution solution (in step 620) and rinsing the substrate (in step 630) may remove the native oxide formed on the surface of the metal film without removing or significantly etching the metal film.

The method 600 shown in FIG. 6 may generally be performed at low temperatures. In some embodiments, the steps of exposing the surface of the substrate to a dissolution solution (in step 620) and rinsing the substrate (in step 630) may be performed at a temperature ranging between 20° C. and 55° C.

The method 600 shown in FIG. 6 may be used to remove native oxides from a wide variety of metal films. In some embodiments, for example, the method 600 shown in FIG. 6 may be used to remove native oxides formed on a wide variety of transition metal films, such as but not limited to, cobalt (Co), copper (Cu), ruthenium (Ru), tungsten (W), molybdenum (Mo), titanium (Ti), tantalum (Ta), platinum (Pt), nickel (Ni), rhodium (Rh) and iridium (Ir) metal films. The method 600 shown in FIG. 6 may also be used to remove metal oxides from other metal and semiconductor films, such as aluminum (Al), gold (Au), silicon (Si), germanium (Ge), etc.

A wide variety of ligands may be included within the dissolution solution used in step 620, depending on the native oxide being removed. In general, the ligand included within the dissolution solution may be selected from a group consisting of β-diketonates, carboxylates, aminopolycarboxylates, oximes, and amines. In some embodiments, the dissolution solution may further include a base, which activates the ligand to accelerate complexation of the ligand with the native oxide. Regardless of the particular ligand used, the ligand included within the dissolution solution may react with and bind to the native oxide, but not to the metal film, thereby forming a self-limiting ligand-metal complex on the metal film.

A wide variety of non-aqueous solvents may also be included within the dissolution solution used in step 620, including but not limited to, polar organic solvents such as alcohols (e.g. methanol, isopropanol, amyl alcohol), ketones (e.g. acetone, methyl ethyl ketone), acetates (e.g. ethyl acetate, amyl acetate), acetonitrile, dimethyl sulfoxide and n-methyl pyrrolidone. Regardless of the particular solvent used, the non-aqueous solvent included within the dissolution solution may be used to selectively dissolve the ligand-metal complex, while preventing reoxidation of the metallic surface once the ligand-metal complex is removed.

FIG. 7 illustrates another embodiment of a method 700 for removing a native oxide formed on a surface of a metal film. The method 700 shown in FIG. 7 may generally begin by receiving a substrate having a metal film exposed on a surface of the substrate, wherein a native oxide is formed on the surface of the metal film (in step 710). Next, the method 700 may include exposing the surface of the substrate to an oxidizing agent to further oxidize the native oxide and form a metal oxide surface layer or a metal hydroxide surface layer (in step 720), and subsequently exposing the surface of the substrate to a dissolution solution comprising a ligand dissolved in a non-aqueous solvent (in step 730). When the native oxide is exposed to the dissolution solution in step 730, the ligand included within the dissolution solution reacts with and binds to the metal oxide surface layer or the metal hydroxide surface layer to form a ligand-metal complex, which is soluble within and selectively dissolved by the non-aqueous solvent. Once the ligand-metal complex is dissolved, the method 700 may include rinsing the substrate to remove the dissolution solution and the ligand-metal complex from the surface of the substrate (in step 740). By exposing the surface of the substrate to the oxidizing agent (in step 720), exposing the surface of the substrate to the dissolution solution (in step 730) and rinsing the substrate (in step 740), the method 700 shown in FIG. 7 selectively removes the native oxide formed on the surface of the metal film without removing the metal film.

The surface of the substrate may be exposed to a wide variety of oxidizing agents in step 720. In some embodiments, for example, the oxidizing agent may be selected from a group consisting of deionized water, air, hydrogen peroxide and ammonium hydroxide. In one embodiment, the surface of the substrate may be exposed to deionized water (in step 720) to further oxidize the native oxide and form a metal hydroxide surface layer on the surface of the metal film. As noted above, the metal hydroxide surface layer may dissolve within the non-aqueous solvent easier than the native oxide.

The surface of the substrate may also be exposed to a wide variety of dissolution solutions in step 730. In some embodiments, exposure to the dissolution solution may result in the formation of a self-limiting ligand-metal complex on the metal film in step 730. To form a self-limiting ligand-metal complex, the ligand included within the dissolution must react with and bind to the native oxide. However, the ligand included within the dissolution does not react with or bind to the metal film after the ligand-metal complex is dissolved within the non-aqueous solvent.

In some embodiments, the steps of exposing the surface of the substrate to the dissolution solution (in step 730) and rinsing the substrate (in step 740) may leave a metallic surface (or a ligand-bound passivating monolayer) on the metal film and prevent further oxidation of the metal film. In some embodiments, for example, the step of rinsing the substrate (in step 740) may include exposing the substrate to a second non-aqueous solvent, which may be the same as (or different from) the non-aqueous solvent used in the dissolution solution. The non-aqueous solvents utilized in steps 730 and 740 do not include oxidizing agents, and thus, prevent intentional oxidation of the metallic surface left on the metal film once the native oxide is selectively removed.

FIG. 8 illustrates one embodiment of a method 800 for stripping a native oxide from a cobalt metal film. The method 800 shown in FIG. 8 may generally begin by receiving a substrate having the cobalt metal film exposed on a surface of the substrate, wherein the native oxide is formed on the cobalt metal film (in step 810). The method 800 may further include exposing the surface of the substrate to a dissolution solution comprising a ligand dissolved in a non-aqueous solvent (in step 830). When the native oxide is exposed to the dissolution solution in step 830, the ligand reacts with and binds to the native oxide to form a ligand-metal complex, which is self-limiting and selectively dissolved with the non-aqueous solvent. The method 800 may further include rinsing the substrate to remove the dissolution solution and the ligand-metal complex from the surface of the substrate (in step 840). By exposing the surface of the substrate to the dissolution solution (in step 830) and rinsing the substrate (in step 840), the method 800 shown in FIG. 8 may strip the native oxide from the cobalt metal film without removing the cobalt metal film.

In some embodiments, the method 800 shown in FIG. 8 may further include exposing the surface of the substrate to an oxidizing agent to convert the native oxide to a cobalt oxide surface layer or a cobalt hydroxide surface layer (in step 820) before exposing the surface of the substrate to the dissolution solution (in step 830). In such embodiments, the ligand contained within the dissolution solution may react with and bind to the cobalt oxide surface layer or the cobalt hydroxide surface layer to form the ligand-metal complex. The surface of the substrate may be exposed to a wide variety of oxidizing agents in step 820. In one embodiment, the surface of the substrate may be exposed to deionized water (in step 820) to further oxidize the native oxide and form a cobalt hydroxide surface layer on the surface of the metal film. As noted above, the cobalt hydroxide surface layer may dissolve within the non-aqueous solvent easier than the native oxide.

A wide variety of ligands and non-aqueous solvents may be included within the dissolution to selectively dissolve the native oxide (or optionally, the cobalt oxide surface layer or the cobalt hydroxide surface layer) in step 830. In one embodiment, the dissolution solution may include acetylacetonate (i.e., the ligand) dissolved in methanol (i.e., the non-aqueous solvent). In some embodiments, the dissolution solution may further include a base, which deprotonates the ligand to accelerate complexation of the ligand with the native oxide. In such embodiments, the base may be selected from a group consisting of quaternary ammonium hydroxides (e.g., tetrabutyl ammonium hydroxide (TBAH), tetramethyl ammonium hydroxide (TMAH)), nitrogenous bases (e.g., trimethylamine, piperidine) and phosphines (e.g., triphenylphosphine). In one embodiment, the base may be tetrabuthyl ammonium hydroxide (TBAH).

In another embodiment, the dissolution solution may include glacial acetic acid (GAC) (i.e., the ligand) dissolved in isopropyl alcohol (IPA) (i.e., the non-aqueous solvent). In some embodiments, a concentration of the GAC in the IPA may range between 0-100%. In one example embodiment, the concentration of GAC in IPA may be approximately 1%.

The processes and methods described herein for stripping native oxide surface layers from metal films provide various advantages over conventional methods used to remove native oxides. For example, the processes and methods described herein are performed at low temperature (e.g., 20° C.-55° C.) using gentle chemistry (e.g., ligands dissolved in non-aqueous solvents), thus, providing minimal risk of damage to device components. The processes and methods disclosed herein use a reactive dissolution chemistry containing ligands in non-aqueous solutions (where the ligands are selective to metal oxides, but not metals), and thus, are inherently self-limiting. Additionally, the disclosed processes and methods are fast, low cost, and do not require expensive vacuum tooling. Instead, the simplicity of the disclosed processes and methods allows for implementation on existing wet processing tools and integration with existing processing infrastructure in BEOL IC fabrication.

The processes and methods described herein can be used to integrate cobalt (and other metals that suffer from native oxide formation) in the BEOL. For example, the processes and methods disclosed herein may be used to pre-treat ultrathin cobalt metal films (e.g., cobalt metal caps, liners, etc.) by selectively removing the native oxide that typically forms on these films during processing or via ambient exposure. In one practical implementation, the processes and methods disclosed herein may ensure fully self-aligned via (FSAV) reliability in the BEOL by stripping native oxides from cobalt capping layers formed on copper interconnects. In another practical implementation, the processes and methods disclosed herein may be used as a cobalt pretreatment method before SAM formation in area-selective dielectric-on-dielectric (DoD) deposition in the BEOL. Selective native oxide stripping is increasingly important as critical dimensions (CDs) continue to shrink in the BEOL. The processes and methods described herein can be used to strip other metal oxides from other metal films.

The processes and methods described herein for removing native oxides from metal films can be accomplished using a variety of techniques. For example, the processes and methods disclosed above may be performed by dipping a substrate having metal features formed thereon in beaker containing the dissolution solution. In this case, the dissolution solution can be removed from the surface of the substrate by either rinsing or dipping the substrate in an appropriate solvent bath. The processes and methods disclosed above may also be performed within a wide variety of semiconductor processing systems. While the disclosed processes can be accomplished using many different process chambers, tools and apparatuses, the processing equipment used to perform the disclosed processes is preferably capable of running at low temperature (e.g., near room temperature and above).

In one example implementation, the wet process described herein may be performed within a spin chamber. When a spin chamber is utilized, etch solutions are dispensed from a nozzle positioned over the substrate and are distributed by the rotational motion of a spin chuck on which the substrate is disposed. After the set exposure time, the nozzle begins dispensing the next solution in the etch recipe. For high volume manufacturing, dispensing of etch solutions and rinses can be executed using conventional tools, such as wet etching tools and rinse tools.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the techniques are described herein with reference to specific embodiments, various modifications and changes can be made without departing from the scope of the present disclosure. Accordingly, the specification and figures are to be regarded in an illustrative rather than a restrictive sense, and such modifications are intended to be included within the scope of the present disclosure. Further, any benefits, advantages, or solutions to problems that are described herein with regard to specific embodiments are not intended to be construed as a critical, required, or essential feature or element of any or all the claims.

What is claimed is:

1. A method for removing a native oxide formed on a surface of a metal film, the method comprising:
   receiving a substrate having the metal film exposed on a surface of the substrate, wherein the native oxide is formed on the surface of the metal film;
   exposing the surface of the substrate to a dissolution solution comprising a ligand dissolved in a non-aqueous solvent, wherein the ligand complexes with the native oxide to form a ligand-metal complex, which is soluble within and selectively dissolved by the non-aqueous solvent; and
   rinsing the substrate with a second non-aqueous solvent to remove the dissolution solution and the ligand-metal complex from the surface of the substrate, thereby leaving a metallic surface or a ligand-bound passivating monolayer on the metal film.

2. The method of claim 1, wherein a thickness of the metal film is less than 10 nm, and wherein a thickness of the native oxide is 5 nm or less.

3. The method of claim 1, wherein the ligand reacts with and binds to the native oxide, but not to the metal film, thereby forming a self-limiting ligand-metal complex on the metal film.

4. The method of claim 1, wherein the ligand is selected from a group consisting of β-diketonates, carboxylates, aminopolycarboxylates, oximes, and amines.

5. The method of claim 1, wherein the non-aqueous solvent used within the dissolution solution is selected from a group consisting of alcohols, ketones, acetates, acetonitrile, dimethyl sulfoxide, and n-methyl pyrrolidone, and wherein the second non-aqueous solvent used to remove the dissolution solution and the ligand-metal complex from the surface of the substrate is the same as or different from the non-aqueous solvent used in the dissolution solution.

6. The method of claim 1, wherein the dissolution solution further comprises a base, which activates the ligand to accelerate complexation of the ligand with the native oxide.

7. The method of claim 1, wherein said exposing the surface of the substrate to the dissolution solution and said rinsing the substrate do not etch the metal film.

8. The method of claim 1, wherein said exposing the surface of the substrate to the dissolution solution and said rinsing the substrate are performed at a temperature ranging between 20° C. and 55° C.

9. A method for removing a native oxide formed on a surface of a metal film, the method comprising:
   receiving a substrate having the metal film exposed on a surface of the substrate, wherein the native oxide is formed on the surface of the metal film;
   exposing the surface of the substrate to an oxidizing agent to further oxidize the native oxide and form a metal oxide surface layer or a metal hydroxide surface layer;
   exposing the surface of the substrate to a dissolution solution comprising a ligand dissolved in a non-aqueous solvent, wherein the ligand reacts with and binds to the metal oxide surface layer or the metal hydroxide surface layer to form a ligand-metal complex, which is soluble within and selectively dissolved by the non-aqueous solvent; and
   rinsing the substrate with a second non-aqueous solvent to remove the dissolution solution and the ligand-metal complex from the surface of the substrate;

wherein said exposing the surface of the substrate to the oxidizing agent, said exposing the surface of the substrate to the dissolution solution and said rinsing the substrate selectively remove the native oxide formed on the surface of the metal film without removing the metal film.

10. The method of claim 9, wherein the oxidizing agent is selected from a group consisting of deionized water, air, hydrogen peroxide and ammonium hydroxide.

11. The method of claim 9, wherein said exposing the surface of the substrate to the oxidizing agent comprises exposing the surface of the substrate to deionized water to oxidize the native oxide and form the metal hydroxide surface layer.

12. The method of claim 9, wherein the ligand does not react with or bind to the metal film after the ligand-metal complex is dissolved within the non-aqueous solvent.

13. The method of claim 9, wherein said exposing the surface of the substrate to the dissolution solution and said rinsing the substrate leaves a metallic surface or a ligand-bound passivating monolayer on the metal film and prevents further oxidation of the metal film.

14. The method of claim 9, wherein the second non-aqueous solvent used to remove the dissolution solution and the ligand-metal complex from the surface of the substrate is the same as or different from the non-aqueous solvent used in the dissolution solution.

15. A method for stripping a native oxide from a cobalt metal film, the method comprising:
receiving a substrate having the cobalt metal film exposed on a surface of the substrate, wherein the native oxide is formed on the cobalt metal film;
exposing the surface of the substrate to a dissolution solution comprising a ligand dissolved in a non-aqueous solvent, wherein the ligand reacts with and binds to the native oxide to form a ligand-metal complex, which is self-limiting and selectively dissolved with the non-aqueous solvent; and
rinsing the substrate with a second non-aqueous solvent to remove the dissolution solution and the ligand-metal complex from the surface of the substrate;
wherein said exposing the surface of the substrate to the dissolution solution and said rinsing the substrate strips the native oxide from the cobalt metal film without removing the cobalt metal film.

16. The method of claim 15, further comprising exposing the surface of the substrate to an oxidizing agent to convert the native oxide to a cobalt oxide surface layer or a cobalt hydroxide surface layer before said exposing the surface of the substrate to the dissolution solution, wherein the ligand contained within the dissolution solution reacts with and binds to the cobalt oxide surface layer or the cobalt hydroxide surface layer to form the ligand-metal complex.

17. The method of claim 16, wherein said exposing the surface of the substrate to the oxidizing agent comprises exposing the surface of the substrate to deionized water to oxidize the native oxide and form the cobalt hydroxide surface layer.

18. The method of claim 15, wherein the ligand comprises acetylacetonate, and wherein the non-aqueous solvent comprises methanol.

19. The method of claim 18, wherein the dissolution solution further comprises a base, which deprotonates the ligand to accelerate complexation of the ligand to the native oxide.

20. The method of claim 19, wherein the base is selected from a group consisting of quaternary ammonium hydroxides, nitrogenous bases and phosphines.

21. The method of claim 15, wherein the ligand comprises glacial acetic acid (GAC), wherein the non-aqueous solvent comprises isopropyl alcohol (IPA), and wherein a concentration of the GAC in the IPA is between 0-100%.

* * * * *